US009893679B2

(12) United States Patent
Sampayan

(10) Patent No.: US 9,893,679 B2
(45) Date of Patent: Feb. 13, 2018

(54) HIGH FREQUENCY MODULATION CIRCUITS BASED ON PHOTOCONDUCTIVE WIDE BANDGAP SWITCHES

(71) Applicant: Lawrence Livermore National Security, LLC, Livermore, CA (US)

(72) Inventor: Stephen Sampayan, Manteca, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 57 days.

(21) Appl. No.: 14/218,860

(22) Filed: Mar. 18, 2014

(65) Prior Publication Data

US 2014/0263976 A1  Sep. 18, 2014

Related U.S. Application Data

(60) Provisional application No. 61/852,103, filed on Mar. 15, 2013.

(51) Int. Cl.
H03C 7/02 (2006.01)

(52) U.S. Cl.
CPC .................................. *H03C 7/025* (2013.01)

(58) Field of Classification Search
CPC .... H04B 17/402; H04B 17/30; H04B 17/364; H03C 7/025
USPC ......... 250/214 LS, 214 SW, 214 R; 327/365, 327/493; 375/242, 244
See application file for complete search history.

(56) References Cited

U.S. PATENT DOCUMENTS

| 5,017,793 | A | * | 5/1991 | Halsey | ................. H03K 17/943 250/551 |
| 5,280,382 | A | * | 1/1994 | Osterwalder | .......... H03K 17/78 327/181 |
| 6,094,458 | A | * | 7/2000 | Hellberg | ................... H03F 3/24 341/143 |
| 7,893,541 | B2 | | 2/2011 | Caporaso et al. | |
| 8,563,930 | B2 | | 10/2013 | Harris et al. | |
| 2009/0103850 | A1 | * | 4/2009 | Shastri | ................. G02F 1/0121 385/3 |
| 2009/0261258 | A1 | | 10/2009 | Harris et al. | |

(Continued)

FOREIGN PATENT DOCUMENTS

| WO | 2010/129804 A1 | 11/2010 |
| WO | 2012/162702 A2 | 11/2012 |

*Primary Examiner* — Georgia Y Epps
*Assistant Examiner* — Don Williams
(74) *Attorney, Agent, or Firm* — Perkins Coie LLP

(57) ABSTRACT

Methods, systems, and devices for high voltage and/or high frequency modulation. In one aspect, an optoelectronic modulation system includes an array of two or more photoconductive switch units each including a wide bandgap photoconductive material coupled between a first electrode and a second electrode, a light source optically coupled to the WBGP material of each photoconductive switch unit via a light path, in which the light path splits into multiple light paths to optically interface with each WBGP material, such that a time delay of emitted light exists along each subsequent split light path, and in which the WBGP material conducts an electrical signal when a light signal is transmitted to the WBGP material, and an output to transmit the electrical signal conducted by each photoconductive switch unit. The time delay of the photons emitted through the light path is substantially equivalent to the time delay of the electrical signal.

11 Claims, 3 Drawing Sheets

(56) References Cited

U.S. PATENT DOCUMENTS

2010/0282949 A1\* 11/2010 Caporaso .............. H01L 31/09
 250/214 SW
2014/0263979 A1 9/2014 Guethlein \* cited by examiner

HIGH FREQUENCY MODULATION CIRCUITS BASED ON PHOTOCONDUCTIVE WIDE BANDGAP SWITCHES

CROSS-REFERENCE TO RELATED APPLICATIONS

This patent document claims benefit of priority of U.S. Provisional Patent Application No. 61/852,103, entitled "HIGH FREQUENCY WIDE BANDGAP MODULATION SYSTEM", and filed on Mar. 15, 2013. The entire content of the aforementioned patent application is incorporated by reference as part of the disclosure of this patent document.

STATEMENT REGARDING FEDERALLY SPONSORED RESEARCH

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This patent document relates to circuits, analog devices and telecommunication technologies.

BACKGROUND

Electronic circuits in most applications are based on electronic circuit elements, such as resistors, capacitors, inductors, transistors, diodes and other circuit modules including amplifiers, oscillators, and switches that are based on the above circuit elements. Such circuits can be implemented in various configurations and can be used in various applications. Electric circuits entirely formed of electrical circuit elements can be limited due to device limitations in the circuit elements. For example, with the ever growing need for compact telecommunication equipment, there is a growing demand for efficient ways in which receiver and transmitter functions can be implemented.

SUMMARY

Techniques, systems, and devices are disclosed for high voltage and/or high frequency modulation.

In one aspect an optoelectronic modulation system includes an array of two or more photoconductive switch units each including a wide bandgap photoconductive material coupled to a first electrode and a second electrode interfaced at opposite ends of the wide bandgap photoconductive material, and a light source optically coupled to the wide bandgap photoconductive material of each photoconductive switch unit via a light path, in which the light path splits into multiple light paths to optically interface with each wide bandgap photoconductive material, such that a time delay of emitted light exists along each subsequent split light path, and in which the wide bandgap photoconductive material conducts an electrical signal between the first and second electrodes when a light signal is transmitted to the wide bandgap photoconductive material. The optoelectronic modulation system includes an output wire to transmit the electrical signal conducted by each photoconductive switch unit. In the system, the time delay of the photons emitted through the light path is substantially equivalent to the time delay of the electrical signal.

In another aspect, a method to modulate an electric signal includes emitting light from a light source along a light path that splits into multiple light paths to produce a time delay of the emitted light along each subsequent split light path; receiving the emitted light at two or more photoconductive switches each structured to include a wide bandgap photoconductive material coupled to a first electrode and a second electrode interfaced at opposite ends of the wide bandgap photoconductive material, in which the wide bandgap photoconductive material conducts an electrical signal between the first and second electrodes when the received light arrives at an optical interface of the wide bandgap photoconductive material having a corresponding time delay to the split light path; and producing a modulated electrical signal at an electrical output electrically coupled to the two or more photoconductive switches from corresponding conducted electrical signals, in which the time delay of photons emitted through a given light path is substantially equivalent to the time delay of the corresponding electrical signal.

In yet another aspect, a method to modulate an electric signal is provided to include providing a circuit having at least two photoconductive switches connected in parallel, wherein each photoconductive switch does not conduct an electrical current in absence of light and become electrically conductive when being exposed to light; directing two light beams to the two photoconductive switches, respectively, to optically activate the two photoconductive switches at two different times with a time delay to cause the photoconductive switches to become electrically conductive with the time delay; and producing a modulated electrical signal from the photoconductive switches to have a signal time corresponding to the time delay in optically activating the two photoconductive switches at two different times.

These and other aspects and their implementations are described in greater detail in the drawings, the description and the claims.

DETAILED DESCRIPTION

Disclosed are techniques, systems, and devices for implementing electrical modulation circuits operating at high frequencies based on wide bandgap (WBG) switches for producing high voltages and high currents in electronic devices. Different from many electronic circuits or devices which are entirely built with electrical circuit elements, the disclosed electrical modulation circuits use switch circuits based on optical excitation of WGB materials and thus are hybrid circuits having both photonic components and electrical circuit elements. The response times of electronic circuits or devices which are entirely built with electrical circuit elements are limited by the RC times of the circuits due to the capacitances and resistances of electrodes and circuit elements. Generally speaking, it can be difficult or expensive to construct all electronic circuits with high operating frequencies, e.g., 1 GHz or above, in part because capacitances and resistances are inherent part of the electrical circuit elements. The disclosed modulation circuits based on WBG switches with fast recombination times can be designed to utilize fast optical excitation and fast switching due to the fast recombination times in WBG materials to enable generation of frequencies well beyond existing limits of circuits of all electrical circuit elements, such as the 1 GHz range. Also disclosed are electronic systems, devices and methods by which this upper frequency limit can be extended.

Figure 1A:
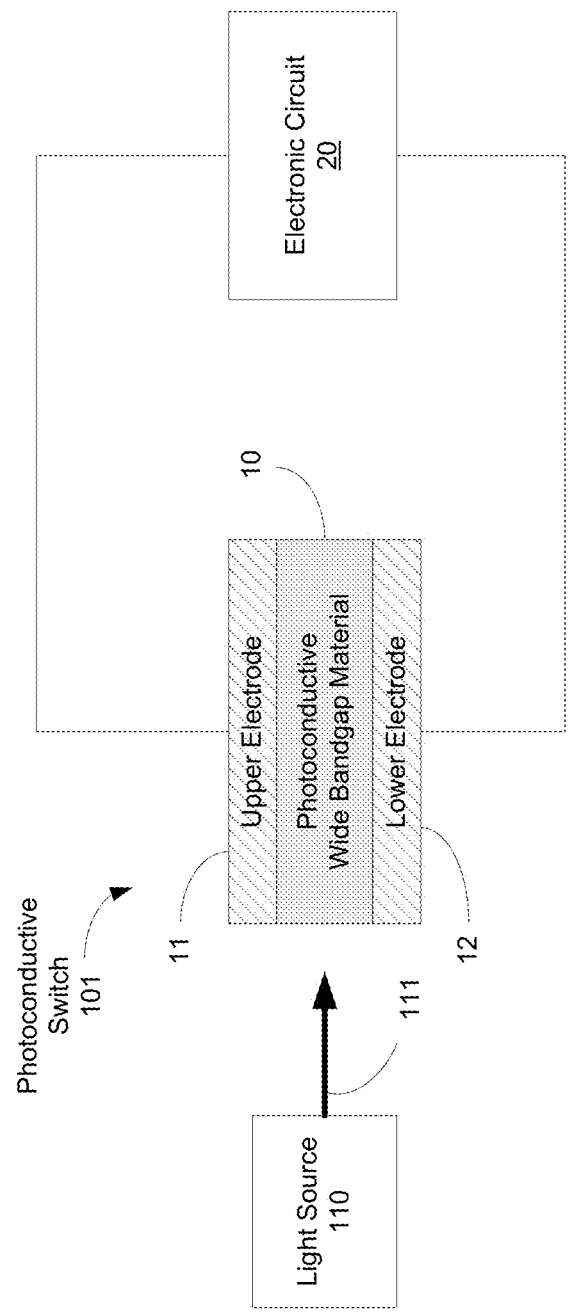
FIG. 1A shows an example of a switch circuit based on optical activation of a photoconductive wide bandgap material.

FIG. 1A shows an example of a switch circuit 101 by using a wide bandgap material 10. The wide bandgap material 10, which can be SiC in some implementations, can absorb radiation such as light to produce charged carriers and thus change the electrical behavior such as the electrical conductivity of the wide bandgap material. As illustrated, the switch circuit 101 includes a substrate of the photoconductive WBG material 10 placed in contact with and located between two electrodes: the upper electrode 11 and the lower electrode 12. A switch circuit 20 is coupled to the electrodes 11 and 12 to supply the electrical power to the electrodes 11 and 12, e.g., a voltage. In absence of light or at a low light level below a threshold, the photoconductive WBG material 10 can behave as an insulator with a large resistance value (e.g., much larger than the circuit impedance) and thus essentially blocks the current flow across the two electrodes 11 and 12 in contact with the photoconductive WBG material 10. When optical energy is directed into the WBG material 10 and absorbed, for example, the WBG material 10 produces charge carriers from the absorbed light to become electrically conductive and the resistance drops to a small value (much less than the circuit impedance). In the switch circuit 101 shown in FIG. 1, a light source 110 is provided to produce light 111 for optically activating the WBG material 10. The optical power and the timing or duration of the optical power in the light 111 can be controlled to control or modulate the conductivity of the WBG material 10 to control the electrical output of the switch circuit 101. In some implementations, one or more radiation beams can be used to illuminate the WBG material. For example, the input may be made with a multiplicity of optical inputs so that a combination of the effects of the multiple optical inputs occur simultaneously on the output. The switching time of such an exemplary WBG photoconductive switch can be short, e.g., several nanoseconds in some implementations. The exemplary photoconductive switches can be designed and structured to handle high voltages and high currents with reduced inductance to provide rapid switching operations or modulation operations, and precise temporal control.

In some implementations, for example, the wide bandgap material 10 in FIG. 1A can include silicon carbide (SiC) or other wide bandgap photoconductive materials. Silicon carbide (SiC) has a high dielectric breakdown strength, greater than that of most solid materials (e.g., about 4 MV/cm); high thermal conductivity (comparable to that of copper); and low optical absorption. Single crystalline Silicon Carbide materials can be used to implement a WBG photoconductive switch in circuits and devices disclosed herein. Some examples of WBG photoconductive switches are disclosed in patent filings by Lawrence Livermore National Security, LLC, including U.S. patent application Ser. No. 13/830,741, entitled "PHOTOCONDUCTIVE SWITCH WITH IMPROVED LIFE SPAN", filed on Mar. 14, 2013, PCT publication No. WO2010129804 A1, entitled "PHOTOCONDUCTIVE SWITCH PACKAGE" based on PCT application PCT/US2010/033923 filed May 6, 2010, which are incorporated by reference in their entirety as part of the disclosure of this patent document. Because of the extremely large current densities and high electrical field stress such wide bandgap materials can sustain, very high peak power can be modulated.

For example, a photoconductive wide bandgap semiconductor material (PWBSM) can be implemented in various modulation circuits to modulate electrical signals by modulating the conduction response of the PWBSM. This is made possible by the demonstrated transconductance-like properties of PWBSM materials, which have shown fast (<1 ns rise-time), high voltage (>15 kV/mm), high current (>1 kA/cm$^2$), and phototransistor-like modulation capabilities at high modulation frequencies (e.g., greater than 300 MHz and at GHz level), such as for example, in a compact, stacked, transmission-line structure. This capability enables various applications for direct manipulation of high voltage electrical signals. Application examples include, for example, compact high power microwave or RF generation, and energy-modulation of charged particle beams (without use of the photoelectric effect) in directed energy systems, i.e. pulsed power for accelerators and other scientific instruments. See, U.S. Pat. No. 8,563,930 entitled "System and method of modulating electrical signals using photoconductive wide bandgap semiconductors as variable resistors" and issued on Oct. 22, 2013 to assignee Lawrence Livermore National Security, LLC, which was previously published as U.S. Patent Application Publication No. US 20090261258 A1 on Oct. 22, 2009. The entire disclosures of U.S. Pat. No. 8,563,930 and U.S. Patent Application Publication No. US 20090261258 A1 are incorporated by reference as part of the disclosure of this patent document.

The photoconductivity of SiC and other PWBSMs under optical excitation generally increases with the optical power or energy absorbed by the PWBSM material. This property of PWBSMs can be used to construct a PWBSM circuit to function as radiation (e.g. light)-controlled resistors, whose resistance decreases when the PWBSM is exposed to radiation or when the optical power or energy of the radiation is increased. However, the photoconductivity of SiC and other PWBSMs exhibits a non-saturated, linear response region when the optical power or energy is below a threshold and a saturated region when the optical power or energy is at or beyond the threshold.

Figure 1B:
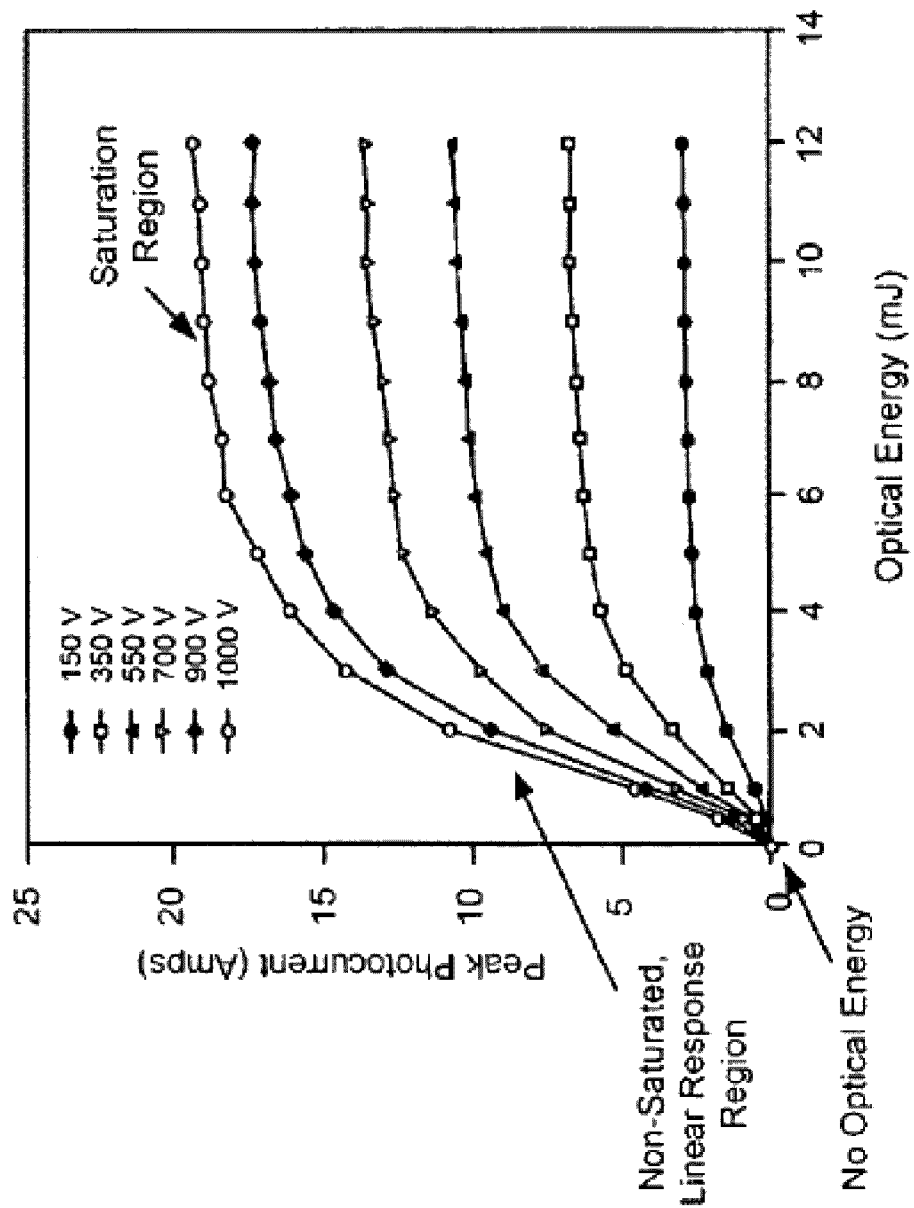
FIG. 1B shows shows examples of measured photoconductive currents measured in sample SiC photoconductive wide bandgap materials under different optical energy levels and under different applied voltages

FIG. 1B shows examples of photoconductive currents of SiC under the influence of such visible optical energy at various optical energies and electrical voltages across the SiC from experiments performed by Applicants at Lawrence Livermore National Laboratory. On the x-axis is the intensity of the visible optical energy onto the SiC material. The resultant current flow is shown on the y-axis for multiple voltages applied across the material. FIG. 1B shows details the current through the SiC switch at various voltages resulting from changing the optical intensity to the switch, and shows high current (>1 kA/cm) capability of wide band gap materials (SiC and GaN) under high gradient (>27 MV/m) switching applications. For approximately a change from 0 to 2 mj in optical energy, the device operates in an essentially linear mode from a dark current of about 1 nA to peak current. For this particular data this current was about 20 A at 1 kV. At higher optical energy >2 mJ, a saturation point is reached where the device achieves a minimum resistance of about 1.OMEGA.. The conduction response curve shown in FIG. 1B can be characterized as having a saturated region, and a non-saturated region.

The data in FIG. 1B shows that the non-saturated region has a substantially linear response that is similar to a typical transistor device. The tested SiC material operates with a transconductance like property of the form: $Gm=\Delta Iout/\Delta\zeta in$, where $\zeta in$ is the controlling input parameter. In the case of a simple transistor, .zeta.in, would be the base current or for a vacuum tube, the control grid voltage. For the SiC material, this parameter is the optical or other radiation energy producing a conduction response. Although the very linear, lower current region was illustrated for clarity, SiC exhibits this transconductance property beyond the maximum current greater than 1 kA/cm$^2$ in the tested devices. And as with transistor and vacuum tube technologies these materials exhibit a steep high gain linear regime from 0-2 mj and a decreased slope saturation region up to >30 mJ. Thus, when the material is operated in the substantially linear non-saturated region, amplification of an applied modulation to the optical pulse will result in amplification of the applied signal. When properly configured, these switches are able to close and open on timescales of nanoseconds or faster, i.e. high frequency modulation.

The disclosed technology is based on the recognition that photonic devices may be incorporated into electric circuits to provide better device performance than all-electrical-element counterpart circuits or provide additional functions that may be difficult to achieve in all-electrical-element circuits.

A wide bandgap modulation device of the disclosed technology can use a wide bandgap photoconductive semiconductor material between two electrodes to use light-induced conductivity for signal modulation. Two technical issues can limit the upper frequency of such a wide bandgap modulation device: (1) the recombination time of the carriers within the wide bandgap photoconductive semiconductor material, and (2) the capacitance between the electrodes. The first is a property of the material, and the second is a property of external circuitry.

Many solid state models predict that the capture cross section of carriers within solid state devices decreases with increased temperature. For example, in silicon, a temperature decrease of 50 K increases the carrier capture cross section by a factor of over 100. The net result of an increased cross section is shorter times for the charge carriers to recombine. Thus, by lowering the temperature, the increase in carrier capture cross section increases the usable upper frequency limit of the material. One of the methods for lowering the temperature is to use immersion cooling in a dielectric fluid that is maintained at a low temperature. Another method is to attach a cooling device such as a TE cooler directly to at least one of the electrodes of wide bandgap modulation device. Additionally, the actual cross sections within the wide bandgap material can be a complex function of temperature and only one temperature may be at the optimum point. Thus, some temperature control may need to be implemented so as to maintain the temperature fixed at an optimum so as to maintain a fast recombination time.

A second aspect of the upper frequency limit within the wide bandgap device is the capacitance between the electrodes. Various methods may be used to decrease the capacitance by using properly shaped electrodes. For example, the use of concentric rings or placement within a transmission line type structure can be implemented. However, capacitances of electrodes and other circuit elements coupled to the switches remain present and thus impose limit to the response times of such switches.

The disclosed technology in this patent document includes two or more WBG switches connected in parallel and uses a delay in optical activation of the two or more WBG switches to produce high frequency signals that are not limited by the capacitances of the electrodes or the circuit. In implementations, for example the disclosed technology can delay the light modulation by using individual light sources each timed appropriately for optically activating the WGB switches. In other implementations, a common light source can be used to generate different optical beams with different delays for optically activating different WBG switches. The techniques and devices may also include active crystals that are used to delay the phase of light, e.g., Lithium Niobate being one of them. Passive transit time may also be used such as air or vacuum spacing or fibers to cause or control the proper delays in optically activating different WBG switches.

The disclosed systems can be implemented to provide additional advantages when using active delay or individual light sources. In such a configuration, upon recombining the generated RF onto individual radiators, an intentional phase steering of the downstream beam pattern can also occur.

The use of two or more different WBG switches connected in parallel in the disclosed technology can distribute the total capacitance into different WBG switches since different WBG switches are separated and individual WBG switches thus can be designed to be smaller, lower capacitance devices.

Figure 2:
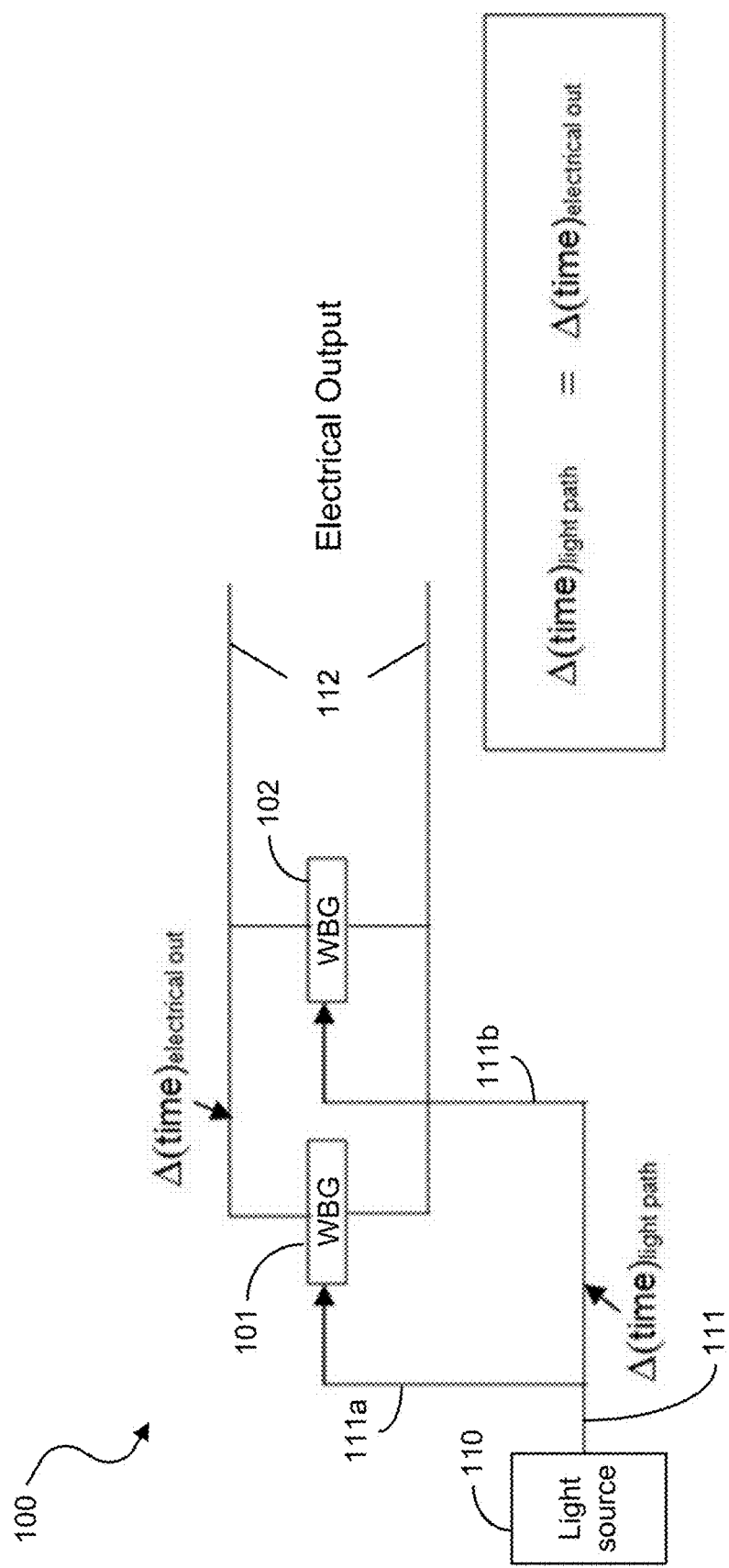
FIG. 2 shows an example an optoelectronic modulation circuit of the disclosed technology using two or more photoconductive wide bandgap switches in FIG. 1A.

FIG. 2 shows an example of an optoelectronic modulation circuit 100 using two wide bandgap (WBG) switch units 101 and 102 to modulate an electronic signal by controlling temporal delays in electronic signal transmission via the WBG switches 101 and 102. Although only two WBG switches are shown for example, the technique can be applied to more than two. The circuit 100 includes a light source 110 to direct light into the wide bandgap photoconductive materials of the WBG switch units 101 and 102 via a light path 111 that splits into multiple light paths (e.g., light path 111a and 111b, in this embodiment), which optically interface with each wide bandgap photoconductive material of the WBG units 101 and 102, respectively. The system 100 produces a time delay of emitted light that exists along each split light path. In some implementations, one or more optical delay elements can be added along the light paths 111a and 111b to control the temporal delay of the input light into the respective WBG switch units. The wide bandgap photoconductive material of the WBG switch units 101 and 102 conducts an electrical signal between electrical connections on opposing sides of the WBG material when the input light signal is transmitted into the wide bandgap photoconductive material. The circuit 100 includes one or more electrical wires 112 to transmit the electrical signal conducted by each WBG switch unit as an electrical output of the system 100.

For example, the WBG switch units 101 and 102 can be operated in a manner analogous to a transistors, in which the WBG material behaves as an electrical insulator when there is an insufficient stimulus (e.g., no or low light input) at a certain threshold level (e.g., optical threshold) and behaves as an electrical conductor when sufficient energy (e.g., light input at or above the threshold) is directed into the WBG material and absorbed, producing charge carriers from the absorbed light to become electrically conductive much like a short circuit.

The optoelectronic modulation circuit 100 of FIG. 1 can be implemented to modulate an electrical signal using a modulated light source. In one example, the system includes an array of two or more photoconductive switch units, each of the photoconductive switch unit including a wide bandgap photoconductive material coupled to a first electrode and a second electrode interfaced at opposite ends of the wide bandgap photoconductive material. The system includes a light source, e.g., such as a coherent light source of energetic photons optically coupled to the wide bandgap photoconductive material of each photoconductive switch unit via a light path (e.g., an optical fiber). In operation, for example, the light source generates a common time varying laser beam transmitted via the light path, which is split into multiple light paths that interface with each wide bandgap photoconductive material of each photoconductive switch. The split light paths carry the multiple laser beams with identical wave functions but varied in time. A time delay is created for each of the laser signals transmitted to the corresponding photoconductive switch. At each of the photoconductive switches, the wide bandgap photoconductive material conducts an electrical signal between the first and second electrodes (based on an applied voltage present across the electrodes from a voltage source) when the laser beam transmits into the wide bandgap photoconductive material. In the described system, the time delay of the modulated light is equivalent to the time delay of the electrical signal, $\Delta time_{light\ path} = \Delta time_{electrical\ out}$, which can be transmitted to an output connected to each photoconductive switch in the array.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An optoelectronic modulation device, comprising:
an array of two or more photoconductive switch units, each photoconductive switch unit including a wide bandgap photoconductive material coupled to a first electrode and a second electrode interfaced at opposite ends of the wide bandgap photoconductive material such that each photoconductive switch is electrically connected to all other photoconductive switches in a parallel configuration, such that a first electrode of one of the photoconductive switch units is in electrical contact with the first electrode of all other photoconductive switch units, and a second electrode of one of the photoconductive switch units is in electrical contact with the second electrode of all other photoconductive switch units, wherein a total capacitance of the array is distributed among the two or more photoconductive switch units to allow generation of electrical signals having a frequency of at least 1 GHz;
a light source optically coupled to the wide bandgap photoconductive material of each photoconductive switch unit via a light path, the light path splitting into multiple light paths to optically interface with each wide bandgap photoconductive material; and
a plurality of electrical wires forming multiple electrical paths that lead to an electrical output providing an output voltage for the array, each of the plurality of electrical wires coupled to a corresponding photoconductive switch to transmit an electrical signal conducted by the wide bandgap photoconductive material in each photoconductive switch unit to the electrical output, and
one or more optical delay elements optically coupled along at least one of the multiple light paths, wherein the one or more optical delay elements are configured to provide an optical time delay associated with activation of a first photoconductive switch with respect to a second photoconductive switch that is substantially equal to, and thus compensates for, an electrical time delay of appearances of the electrical signals associated with the first and the second photoconductive switches at the electrical output, such that the electrical signals from the first and second photoconductive switches simultaneously reach the electrical output.

2. The device of claim 1, wherein the light source includes a coherent light source of energetic photons.

3. The device of claim 1, wherein the one or more optical delay elements include active crystals of Lithium Niobate to provide the optical time delay.

4. The device of claim 1, wherein the one or more optical delay elements include optical fiber to produce the optical time delay of the emitted light on at least one of the multiple light paths.

5. The device of claim 1, wherein the wide bandgap photoconductive material includes SiC.

6. The device of claim 1, comprising:
a temperature controller coupled to the wide bandgap photoconductive material to maintain the wide bandgap photoconductive material at a low temperature to obtain a short recombination time for the wide bandgap photoconductive material.

7. A method to modulate an electric signal, comprising:
providing a circuit having at least two photoconductive switches connected in parallel, wherein a first electrode of one of the photoconductive switches is in electrical contact with a first electrode of all other photoconductive switches, and a second electrode of one of the photoconductive switches is in electrical contact with a second electrode of all other photoconductive switches, and wherein each photoconductive switch does not conduct an electrical current in absence of light and become electrically conductive when being exposed to light and each photoconductive switch including a wide bandgap photoconductive material, and wherein a total capacitance of the array is distributed among the two photoconductive switches to allow generation of modulated electrical signals having a frequency of at least 1 GHz;

directing two light beams in two optical paths to the two photoconductive switches, respectively, to optically activate the two photoconductive switches at two different times such that the photoconductive switches become electrically conductive with a time delay with respect to one another;

directing modulated electrical signals produced by the two photoconductive switches through two electrical paths to an output of the circuit, wherein the time delay between the two optical paths configured to be substantially equal to, and thus compensate for, a time delay between the two electrical paths, such that the modulated electrical signals produced by the two photoconductive switches simultaneously reach the output of the circuit.

8. The method of claim 7, comprising:

using a single light source to produce light for the two light beams; and splitting the light from the single light source into the two light beams directed to the two photoconductive switches.

9. The method of claim 8, comprising:

control light paths of the two light beams to control the time delay.

10. The method of claim 8, comprising:

using two different light sources to produce the two light beams, respectively.

11. The method of claim 8, comprising:

maintaining the wide bandgap photoconductive material at a low temperature to obtain a short recombination time for the wide bandgap photoconductive material.

* * * * *